(12) United States Patent
Egli et al.

(10) Patent No.: US 7,780,839 B2
(45) Date of Patent: Aug. 24, 2010

(54) ELECTROPLATING BRONZE

(75) Inventors: Andre Egli, Lucerne (CH); Qing Chen, Fanling (HK)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 8 days.

(21) Appl. No.: 12/316,158

(22) Filed: Dec. 10, 2008

(65) Prior Publication Data

US 2009/0188807 A1  Jul. 30, 2009

Related U.S. Application Data

(60) Provisional application No. 61/007,392, filed on Dec. 12, 2007.

(51) Int. Cl.
*C25D 3/58* (2006.01)

(52) U.S. Cl. .................................................. 205/241
(58) Field of Classification Search .................. 205/241
See application file for complete search history.

(56) References Cited

U.S. PATENT DOCUMENTS 6,607,653 B1 * 8/2003 Tsuji et al. .................. 205/241

OTHER PUBLICATIONS

Chen et al., "Some Heterocyclic Compounds as Corrosion Inhibitors of Bronze", Fudan Xuebao, Ziran Kexueban (no month, 1996), vol. 35, No. 3, pp. 295-304.*

* cited by examiner

*Primary Examiner*—Edna Wong
(74) *Attorney, Agent, or Firm*—John J. Piskorski

(57) ABSTRACT

Electrolytes for white bronzes are disclosed as well as methods of depositing the white bronzes. The electrolytes for depositing the white bronzes are cyanide free and provide a uniform white color.

9 Claims, No Drawings

ELECTROPLATING BRONZE

The present application claims the benefit of U.S. Provisional Application No. 61/007,392, filed Dec. 12, 2007, which application is incorporated herein in its entirety.

The present invention is directed to electroplating white bronze from non-cyanide containing electrolytes. More specifically, the present invention is directed to electroplating bronze from non-cyanide containing electrolytes to provide white bronze deposits with uniform color and brightness.

Methods for depositing tin and tin alloys on the basis of various types of electrolytes are known in the industry and are widely used in practice. Methods for deposition of tin and tin alloys from cyanide electrolytes are common. Such electrolytes, however, are toxic, which makes their use problematic from the environmental standpoint, such that for some years there has been a push to develop cyanide-free electrolytes, for example electrolytes based on pyrophosphates or oxalates, which operate in a pH region of 5-9. However, such methods have both economic and technical disadvantages, such as slow deposition rates.

For these reasons development is currently going mostly in the direction of making available methods for deposition of tin and tin alloys from acid electrolytes because divalent tin can be reduced to metallic tin in acid electrolytes, which leads to better deposition rates while having qualitatively equivalent coatings. However, such methods have their limits in the deposition of tin/copper alloys with high copper content, such as the so-called "true" bronzes, which have a copper content of at least 10%. For example due to the difference of potential between tin and copper higher rates of oxidation of the divalent tin can occur, and the divalent tin becomes oxidized to tetravalent tin in the acid electrolytes. In its tetravalent form tin can no longer be deposited electrolytically in an acid environment. This leads to uneven deposition of the two metals and decreases the deposition rate. In addition, oxidation to tetravalent tin leads to increased sludge formation, which can compromise the electrolyte stability and shortens the lifetime of the electrolyte. Such contamination also may result in poor bonding as well as pore formation in the coating.

Because of such process disadvantages, electrolytically deposited bronze coatings are uncommon. However, electrodeposition of bronzes is gaining importance in some technical fields, for example in electronics for coating electronic components or in mechanical engineering and in process technology for coating bearing overlays and friction layers. Also, white bronzes may be deposited as nickel substitutes. Occasionally, bronze coatings are used in jewelry as a substitute for expensive silver or allergy-triggering nickel.

U.S. 20060137991 discloses a method for depositing a bronze coating from an acid electrolyte that contains tin and copper ions, an alkylsulfonic acid and aromatic wetting agents of α-naphthol ethoxylate and nonylphenol ethoxylate. Although the electrolyte is cyanide free, there is still a need for an electrolyte which is cyanide free and provides a uniform and bright white bronze deposit.

In one aspect a composition includes one or more sources of tin ions, one or more sources of copper ions and one or more mercaptans selected from the group consisting of mercaptotriazoles and mercaptotetrazoles. The aqueous tin/copper alloy electroplating compositions are cyanide free and environmentally friendly. In addition to sources of tin and copper ions and mercaptans, the compositions may include one or more conventional additives.

In another aspect a method includes contacting a substrate with a composition including one or more sources of tin ions, one or more sources of copper ions and one or more mercaptans selected from the group consisting of mercaptotriazoles and mercaptotetrazoles; and depositing an alloy on the substrate. The alloy deposited by the method provides a stable, uniform, bright white bronze deposit on substrates.

The white bonze may be used in the electronics industry for coating electronic components and in process technology for coating bearing overlays and friction layers. The white bronze may also be used in jewelry and as a nickel replacement. Plastics also may be plated with the white bronze.

As used throughout the specification, the following abbreviations have the following meaning, unless the context clearly indicates otherwise: ° C.=degrees Centigrade; g=grams; L=liter; mL=milliliter; mm=millimeter; A=amperes; dm=decimeter; μm=micron=micrometer and ppm=parts per million; terms "electroplating", "plating" and "depositing" are used interchangeably throughout the specification; terms the terms "film" and "layer" are used interchangeably throughout the specification. All numerical ranges are inclusive and combinable in any order, except where it is logical that such numerical ranges are construed to add up to 100%.

Compositions include one or more sources of tin ions, one or more sources of copper ions and one or more mercaptans selected from the group consisting of mercaptotriazoles and mercaptotetrazoles. The aqueous electrolyte compositions are cyanide free and environmentally friendly.

Sources of tin include, but are not limited to, stannous organic sulfonate, such as stannous methanesulfonate, stannous sulfate, stannous gluconate, stannous citrate, stannous lactate and stannous halides, such as stannous bromide, stannous chloride, stannous chloride dihydrate. Many of such stannous salts are commercially available. Content of the stannous salt, based on the converted amount into the weight of $Sn^{2+}$, may be in the range such as from 1 g/L to 150 g/L or such as from 5 g/L to 30 g/L.

Sources of copper ions include, but are not limited to, cuprous salts or cupric salts. Cuprous salts ($Cu^+$) include, but are not limited to, cuprous oxide, cuprous chloride, cuprous bromide and cuprous iodide. Cupric salts ($Cu^{2+}$) include, but are not limited to, cupric organosulfate, such as cupric methanesulfonate, cupric sulfate, cupric chloride, cupric bromide, cupric iodide, cupric oxide, cupric phosphate, cupric pyrophosphate, cupric acetate, cupric citrate, cupric gluconate, cupric tartrate, cupric lactate, cupric succinate, cupric sulfamate, cupric borofluoride, cupric formate and cupric silicofluoride. Content of the copper salt, based on the converted amount into the weight of $Cu^+$ or $Cu^{2+}$, may be in the range of 0.5 g/L to 150 g/L or such as from 10 g/L to 50 g/L.

Mercaptans include compounds selected from the group consisting of mercaptotriazoles and mercaptotetrazoles. Such mercaptans may be prepared from the literature or may be obtained commercially. While not being bound by theory, such mercaptans are believed to stabilize the tin and copper ions at their low oxidation states, thus improving the homogeneity of the tin/copper alloy. Such mercaptans are included in the compositions in amounts of 0.001 g/L to 100 g/L or such as from 0.01 g/L to 50 g/L or such as from 1 g/L to 10 g/L.

Mercaptotriazoles have the following general formula:

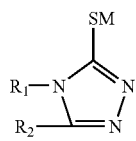

wherein M is hydrogen, $NH_4$, sodium or potassium and $R_1$ and $R_2$ are independently ($C_1$ to $C_{18}$)alkyl, substituted or unsubstituted or ($C_6$ to $C_{10}$)aryl, substituted or unsubstituted. Substituent groups include, but are not limited to, alkoxy, phenoxy, halogen, nitro, amino, sulfo, sulfamyl, substituted sulfamyl, sulfonylphenyl, sulfonyl-alkyl, fluorosulfonyl, sulfonamidophenyl, sulfonamido-alkyl, carboxy, carboxylate, ureido, carbamyl, carbamyl-phenyl, carbamylalkyl, carbonylalkyl and carbonylphenyl. Such mercaptotriazoles include, but are not limited to, 5-ethyl-3-mercapto-4-phenyl-1,2,4-triazole, 3-mercapto-5-pentyl-4-phenyl-1,2,4-triazole, 4,5-diphenyl-3-mercapto-1,2,4-triazole, 3-mercapto-4-phenyl-5-undecyl-1,2,4-triazole, 4,5-diethyl-3-mercapto-1,2,4-triazole, 4-ethyl-3-mercapto-5-pentyl-1,2,4-triazole, 4-ethyl-3-mercapto-5-phenyl-1,2,4-triazole, 5-p-aminophenyl-4-ethyl-3-mercapto-1,2,4-triazole, 5-p-acetoamidephenyl-4-ethyl-3-mercapto-1,2,4-triazole, 5-p-capronamidephenyl-4-ethyhl-3-mercapto-1,2,4-triazole and 4-ethyl-5-p-lauroamidephenyl-3-mercapto-1,2,4-triazole.

Mercaptotetrazoles have a general formula:

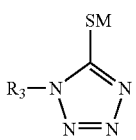

where M is hydrogen, $NH_4$, sodium or potassium and $R_3$ is ($C_1$ to $C_{20}$)alky, substituted or unsubstituted, or ($C_6$ to $C_{10}$) aryl, substituted or unsubstituted. Substituents include, but are not limited to, alkoxy, phenoxy, halogen, nitro, amino, substituted amino, sulfo, sulfamyl, substituted sulfamyl, sulfonylphenyl, sulfonyl-alkyl, fluorosulfonyl, sulfoamidophenyl, sulfonamide-alkyl, carboxy, carboxylate, ureido carbamyl, carbamyl-phenyl, carbamylalkyl, carbonylalkyl and carbonylphenyl. Such mercaptotetrazoles include, but are not limited to, 1-(2-dimethylaminoethyl)-5-mercapto-1,2,3,4-tetrazole, 1-(2-diethylaminoethyl)-5-mercapto-1,2,3,4-tetrazole, 1-(3-methoxyphenyl)-5-mercaptotetrazole, 1-(3-ureidophenyl)-5-mercaptotetrazole, 1-((3-N-carboxymethyl)-ureidophenyl)-5-mercaptotetrazole, 1-((3-N-ethyl oxalamido)phenyl)-5-mercaptotetrazole, 1-(4-acetamidophenyl)-5-mercapto-tetrazole and 1-(4-carboxyphenyl)-5-mercaptotetrazole.

Typically, the mercaptotetrazoles are used in the tin/copper alloy compositions. More typically the mercaptotetrazoles where $R_3$ includes an amino substituent, substituted or unsubstituted, are included in the compositions.

The compositions also may include one or more optional additives. Such additives include, but are not limited to, surfactants or wetting agents, complexing or chelating agents, antioxidants, brighteners, grain refiners, buffers and conductivity agents.

Surfactants or wetting agents include, but are not limited to ethylene oxide ("EO") and/or propylene oxide ("PO") derivatives of aliphatic alcohols containing one or more alkyl group or ethylene oxide- and/or propylene oxide-derivatives of aromatic alcohols. The aliphatic alcohols may be saturated or unsaturated. Such aliphatic and aromatic alcohols may be further substituted, for example, with sulfate or sulfonate groups. Suitable wetting agents include, but are not limited to, ethoxylated polystyrenated phenol containing 12 moles of EO, ethoxylated butanol containing 5 moles of EO, ethoxylated butanol containing 16 moles of EO, ethoxylated butanol containing 8 moles of EO, ethoxylated octanol containing 12 moles of EO, ethoxylated octylphenol containing 12 moles of EO, ethoxylated/propoxylated butanol, ethylene oxide/propylene oxide block copolymers, ethoxylated beta-naphthol containing 8 or 13 moles of EO, ethoxylated beta-naphthol containing 10 moles of EO, ethoxylated bisphenol A containing 10 moles of EO, ethoxylated bisphenol A containing 13 moles of EO, sulfated ethoxylated bisphenol A containing 30 moles of EO, and ethoxylated bisphenol A containing 8 moles of EO. Typically, such non-ionic surfactants or wetting agents are added in an amount of 0.1 g/L to 50 g/L, and preferably 0.5 g/L to 10 g/L.

Complexing or chelating agents include, but are not limited to, carboxylic acids and salts thereof, such as dicarboxylic acids, which include, but are not limited to, oxalic acid, malonic acid, succinic acid, tartaric acid and malic acid, tricarboxylic acids which include, but are not limited to, citric acid, and tricarballylic acid, aromatic carboxylic acids, which include, but are not limited to, phenylacetic acid, benzoic acid, and anisic acid, and amino carboxylic acids, which include, but are not limited to, iminodiacetic acid, nitrilotriacetic acid (NTA), ethylenediamine tetraacetic acid (EDTA), ethylenediamine-disuccinic acid and diethylenetriamine pentaacetic acid, N-heterocyclic carboxylic acids such as picolinic acid, dipicolinic acid, pyrazine carboxylic acid and pyrazine dicarboxylic acid. Salts of the foregoing acids also may be used. Such salts include, but are not limited to, alkali metal salts, such as sodium, potassium and lithium salts. Such complexing or chelating agents are included in the compositions in amounts of 10 g/L to 100 g/L, or such as from 15 g/L to 50 g/L.

Antioxidants may be added to the compositions to assist in keeping the tin in a soluble, divalent state. Such antioxidants include, but are not limited to, carboxylic acids, such as gallic acid and acetic acid, cresol, hydroquinone, hydroquinonesulfonic acid and hydroxylated aromatic compounds, such as resorcinol, catechol and pyrocatechole. Such antioxidants are included in the compositions in amounts of 0.1 g/l to 5 g/L.

Other compounds which may help to minimize oxidation of stannous tin include, but are not limited to, aromatic diols such as unsubstituted and substituted benzenediols, naphthalenediols, anthracenediols or mixtures thereof. Substituents, which may be present on the substituted benzendiols and naphthalenediols, include, but are not limited to, alkyl of up to 12 carbon atoms, halogen such as chloro, cycloalkyl such as cyclohexyl and aryl such as phenyl. Aromatic diols include, but are not limited to, 1,2-benzenediol, methyl-1,4-benzendiol, cyclohexyl-1,4-benzendiol, phenyl-1,4-benzenediol, 1,2-naphthalenediol and 1,4-naphthalenediol. Aromatic diols may be included in the compositions in amounts of 0.05 g/L to 10 g/L.

Optional brighteners which may be added to the tin/copper alloy compositions include, but is not limited to, aromatic aldehydes, such as chlorobenzaldehyde, derivatives of aromatic aldehydes such as benzalacetone and aliphatic aldehydes, such as acetaldehyde and glutaraldehyde. Other suitable brighteners include, but are not limited to, bismuth nitrate, cobalt nitrate, antimonyl chloride and selenic acid. Such brighteners are included in the compositions in amounts of 0.5 g/L to 3 g/L.

Conductivity agents may be included in the electrolyte compositions to maintain a suitable current in the compositions during electroplating. Such conductivity agents include, but are not limited to, alkali metal sulfates, such as sodium sulfate, alkali metal alkanesulfonates, such as sodium methane sulfonate, alkali metal chlorides, such as sodium chloride or potassium chloride, ammonium sulfate, methane sulfonic acid, sulfuric acid, citric acid, sodium acetate, sodium carbonate, diluent soluble salts of citrates, such as ammonium citrate, lactates, gluconates, such as sodium gluconate, potassium pyrophosphate, or mixtures thereof. Such conductivity agents also help maintain the pH of the compositions. Conductivity agents may be employed in amounts such as from 5 gm/L to 300 gm/L or such as from 20 gm/L to 150 gm/L.

Grain refiners may be added to further improve deposit appearance and operating current density range. Such grain refiners include, but are not limited to, alkoxylates, such as the polyethoxylated amines JEFFAMINE T-403 or TRITON RW, sulfated alkyl ethoxylates, such as TRITON QS-15, and gelatin or gelatin derivatives. The amounts of such grain refiners range from 0.01 to 20 mL/L, or such as from 0.5 to 8 mL/L, or such as from 1 to 5 mL/L.

Other grain refiners include metals in amounts of 1 ppm to 10 ppm. Such metals include, but are not limited to bismuth, antimony, silver, indium, tellurium, selenium, iron, cobalt, zinc and chromium. When iron, cobalt, chromium and zinc are used, the pH of the electrolyte ranges from 8 to 10. The metals are included in the electrolyte in their ionic forms and are added to the electrolyte by means of their water soluble salts.

Silver salts which may be used include, but are not limited to, silver alkanesulfonates, silver sulfate, silver chloride, silver gluconate, silver citrate, silver lactate and silver nitrate. Bismuth salts include, but are not limited to, bismuth nitrate, bismuth acetate and bismuth tartrate. Indium salts include, but are not limited to, indium chloride, indium sulfate and indium alkanesulfonates. Antimony salts include, but are not limited to, antimony lactate and antimony potassium tartrate. Typically, selenium and tellurium are added as their dioxides. Iron salts include, but are not limited to, ferric bromide and anhydrous ferric chloride. Cobalt salts include, but are not limited to, cobaltous nitrate, cobaltous bromide and chloride. Zinc salts include, but are not limited to, zinc lactate and zinc nitrate. Chromium salts include, but are not limited to, chromous bromide, chromous chloride and chromous formate.

The white bronze binary alloy includes from 5 wt % to 60 wt % tin and 40 wt % to 95 wt % copper or such as from 10 wt % to 40 wt % tin and 60 wt % to 90 wt % copper. Typically, white bronze deposits electroplated from the acidic electrolytes have equilibrium and non-equilibrium structures such as $Cu_6Sn_5$ or $Cu_3Sn$. The white bronze binary alloy has a uniform white, bright color, which helps post-electroplate metal top layers, such as chromium. Also, the binary alloy is stable.

In addition to the binary alloy of tin/copper, the metals listed above may be included in amounts to form ternary alloys to improve the corrosion and wear resistance of the white bronze. Typically, a third metal is included in the compositions in amounts of 0.5 g/L to 100 g/L, or such as from 1 g/L to 50 g/L or such as from 5 g/L to 20 g/L. Such ternary alloys include, but are not limited to, tin/copper/silver, tin/copper/bismuth, tin/copper/antimony, tin/copper/indium, tin/copper/cobalt and tin/copper/zinc.

The ternary alloy includes from 10 wt % to 30 wt % tin, 30 wt % to 65 wt % copper and 5 wt % to 60 wt % of a third metal. Typically, the ternary alloy includes 15 wt % to 25 wt % tin, 50 wt % to 60 wt % copper and 15 wt % to 45 wt % of the third metal. The ternary alloys have a uniform bright white appearance and are stable.

Substrates are contacted for a sufficient time with electrolyte composition to electroplate a white bronze film ranging from 0.01 µm to 20 µm or such as from 0.1 µm to 10 µm or such as from 1 µm to 5 µm. The electrolyte composition may be applied by vertical application where the composite substrate is immersed in a bath of the electrolyte composition, or the electrolyte composition may be sprayed on the substrate such as in horizontal electroplating. Other examples of electroplating include, but are not limited to, rack plating, barrel plating, and high speed plating such as hoop plating or jet plating.

A cathode current density may be in a range of $0.01 \text{ A/dm}^2$ to $20 \text{ A/dm}^2$. The range may vary depending on the method used. For example in rack plating the current density may range from $0.5 \text{ A/dm}^2$ to $5 \text{ A/dm}^2$ or such as from $1 \text{ A/dm}^2$ to $3 \text{ A/dm}^2$. In barrel plating the current density may range from $0.01 \text{ A/dm}^2$ to $1 \text{ A/dm}^2$ or such as from $0.1 \text{ A/dm}^2$ to $0.5 \text{ A/dm}^2$. The anode may be a soluble or an insoluble anode. An example of a soluble anode is a tin electrode. Examples of insoluble anodes are iridium dioxide or platinum dioxide. Other types of soluble and insoluble anodes are suitable. Any suitable power source may be employed to generate an electrical current. Many are well known by those of skill in the art.

Plating temperatures may range from 15° C. to 100° C. or such as from 20° C. to 50° C. The electroplating composition may be stirred. If it is stirred, it is stirred by cathode rocking or liquid fluidization by pumping, anode rotation or by a stirrer.

The pH of the electrolyte ranges from 0 to 10. Typically, the pH range is from 1 to 8. More typically, the pH ranges from 2 to 5.

Substrates include, but are not limited to, iron, iron alloys, copper, copper alloys, nickel, nickel alloys, jewelry, electronic components and plastics. Electronic components include, but area not limited to, connectors, lead frames, packaging, optoelectronic components and printed wiring boards. Plastics which may be plated with the electrolyte compositions include, but are not limited to, polyaniline and polythiophene. Plastics such as polyethylene, polyimide, polyurethane, acrylic and epoxy resins which include conductive fillers also may be plated with the electrolyte compositions.

The following examples are intended to further illustrate embodiments of the invention but are not intended to limit the scope of the invention.

EXAMPLE 1

The following aqueous electrolyte composition is prepared:

TABLE 1

| COMPONENT | AMOUNT |
|---|---|
| Stannous sulfate | 7 g/l |
| Copper sulfate pentahydrate | 0.5 g/L |
| Sulfuric acid (concentrated) | 200 mL/L |
| Ethylenediamine disuccinic acid | 10 g/L |
| 1-(2-dimethylaminoethyl)-5-mercapto-1,2,3,4-tetrazole | 1 g/L |
| Picolinic acid | 0.5 g/L |
| Pyrocatechole | 50 g/l |

TABLE 1-continued

| COMPONENT | AMOUNT |
|---|---|
| EO/PO block copolymer | 50 g/L |
| Benzalacetone | 0.5 g/L |

Five copper ingots are placed in five separate Hull cells having the above aqueous electrolyte. The pH is maintained at 1 and the temperature is maintained at 30° C. The anode in each Hull cell is a platinum dioxide insoluble anode. The copper ingots and anodes are joined to a conventional rectifier.

Electroplating is done at a current density of 10 A/dm$^2$. The copper ingots are electroplated until each is coated with a white bronze layer of 20 μm. The white bonze plated copper ingots are rinsed with deionized water and air dried. The white bronze coating on each ingot is expected to have a uniform, bright white color.

EXAMPLE 2

The following aqueous electrolyte composition is prepared:

TABLE 2

| COMPONENT | AMOUNT |
|---|---|
| Stannous sulfate | 5 g/L |
| Copper sulfate pentahydrate | 10 g/L |
| Sulfuric acid (concentrated) | 250 mL/L |
| NTA | 35 g/L |
| 1-(2-diethylaminoethyl)-5-mercapto-1,2,3,4-tetrazole | 2 g/L |
| Picolinic acid | 0.5 g/L |
| Pyrocatechole | 50 g/L |
| EO/PO block copolymer | 200 mL/L |
| Benzalactone | 0.5 g/L |
| Bismuth nitrate | 2 g/L |

Five copper ingots are placed in five separate Hull cells having the above aqueous electrolyte. The pH is maintained at less than 1 and the temperature is maintained at 30° C. The anode in each Hull cell is a platinum dioxide insoluble anode. The copper ingots and anodes are joined to a conventional rectifier.

Electroplating is done at a current density of 5 A/dm$^2$. The copper ingots are electroplated until each is coated with a white bronze layer of 10 μm. The white bonze plated copper ingots are rinsed with deionized water and air dried. The white bronze coating on each ingot is expected to have a uniform, bright white color.

EXAMPLE 3

The following aqueous electrolyte composition is prepared:

TABLE 3

| COMPONENT | AMOUNT |
|---|---|
| Stannous methanesulfonate | 10 g/L |
| Cupric methanesulfonate | 15 g/L |
| Methane sulfonic acid | 40 g/L |
| EDTA | 25 g/L |
| 5-ethyl-3-mercapto-4-phenyl-1,2,4-triazole | 0.01 g/L |
| Hydroquinone | 0.1 g/L |
| Acetaldehyde | 0.05 g/L |
| EO/PO block copolymer | 10 g/L |

Five nickel ingots are placed in five separate Hull cells having the above aqueous electrolyte. The pH is maintained at 2 and the temperature is maintained at 40° C. The anode in each Hull cell is a platinum dioxide insoluble anode. The nickel ingots and anodes are joined to a conventional rectifier.

Electroplating is done at a current density of 2 A/dm$^2$. The nickel ingots are electroplated until each is coated with a white bronze layer of 8 μm. The white bonze plated nickel ingots are rinsed with deionized water and air dried. The white bronze coating on each ingot is expected to have a uniform, bright white color.

EXAMPLE 4

The following aqueous electrolyte composition is prepared:

TABLE 4

| COMPONENT | AMOUNT |
|---|---|
| Stannous methane sulfonate | 15 g/L |
| Cupric methane sulfonate | 20 g/L |
| Cobaltous chloride | 1 g/L |
| 4,5-diethyl-3-mercapto-1,2,4-triazole | 3 g/L |
| Methane sulfonic acid | 50 g/L |
| NTA | 30 g/L |
| Hydroquinone | 25 g/L |
| Glutaraldehyde | 1 g/L |
| Antimonyl chloride | 10 ppm |

Five polyaniline plates are placed in five separate Hull cells having the above aqueous electrolyte. The pH is maintained at 3 and the temperature is maintained at 50° C. The anode in each Hull cell is a platinum dioxide insoluble anode. The polyaniline plates and anodes are joined to a conventional rectifier.

Electroplating is done at a current density of 5 A/dm$^2$. The plates are electroplated until each is coated with a white bronze layer of 10 μm. The white bonze plated polyaniline plates are rinsed with deionized water and air dried. The white bronze coating on each plate is expected to have a uniform, bright white color.

EXAMPLE 5

The following aqueous electrolyte is prepared:

TABLE 5

| COMPONENT | AMOUNT |
|---|---|
| Stannous sulfate | 10 g/L |
| Copper sulfate pentahydrate | 25 g/L |
| 1-(3-methoxyphenyl)-5-mercaptotetrazole | 0.01 g/L |
| Sulfuric acid (concentrated) | 250 mL/L |
| EDTA | 20 g/L |
| Picolinic acid | 0.5 g/L |
| Hydroquinone | 20 g/L |
| EO/PO block copolymer | 15 g/L |
| Selenic acid | 1 g/L |

Five steel ingots are placed in five separate Hull cells having the above aqueous electrolyte. The pH is maintained at 1 and the temperature is maintained at 20° C. The anode in each Hull cell is a platinum dioxide insoluble anode. The steel ingots and anodes are joined to a conventional rectifier.

Electroplating is done at a current density of 15 A/dm$^2$. The steel ingots are electroplated until each is coated with a white bronze layer of 20 μm. The white bonze plated steel ingots are rinsed with deionized water and air dried. The white bronze coating on each ingot is expected to have a uniform, bright white color.

What is claimed is:

1. A composition comprising one or more sources of tin ions, one or more sources of copper ions and one or more mercaptotetrazoles selected from the group consisting of 1-(2-dimethylaminoethyl)-5-mercapto-1,2,3,4-tetrazole, 1-(2-diethylaminoethyl)-5-mercapto-1,2,3,4-tetrazole, 1-(3-methoxyphenyl)-5-mercaptotetrazole, 1-(3-ureidophenyl)-5-mercaptotetrazole, 1-((3-N-carboxymethyl)-ureidophenyl)-5-mercaptotetrazole, 1-((3-N-ethyl oxalamido)phenyl)-5-mercaptotetrazole, 1-(4-acetamidophenyl)-5-mercaptotetrazole and 1-(4-carboxyphenyl)-5-mercaptotetrazole.

2. The composition of claim 1, wherein the composition is free of cyanide.

3. The composition of claim 1, wherein the mercaptotetrazoles range from 0.001 g/L to 100 g/L.

4. The composition of claim 1, further comprising one or more sources of a third metal.

5. The composition of claim 1, wherein the mercaptotetrazoles are selected from the group consisting of 1-(2-dimethylaminoethyl)-5-mercapto-1,2,3,4-tetrazole and 1-(2-diethylaminoethyl)-5-mercapto-1,2,3,4-tetrazole.

6. A method comprising:
a) contacting a substrate with a composition comprising one or more sources of tin ions, one or more sources of copper ions and one or more mercaptotetrazoles selected from the group consisting of 1-(2-dimethylaminoethyl)-5-mercapto-1,2,3,4-tetrazole, 1-(2-diethylaminoethyl)-5-mercapto-1,2,3,4-tetrazole, 1-(3-methoxyphenyl)-5-mercaotototetrazole, 1-(3-ureidophenyl)-5-mercaptoterazole, 1-((3-N-carboxymethyl)-ureidophenyl)-5-mercaptotetrazole, 1-((3-N-ethyl oxalamido)phenyl)-5-mercaptotetrazole, 1-(4-acetamidophenyl)-5-mercapto-tetrazole and 1-(4-carboxyphenyl)-5-mercaptotetrazole; and
b) generating an electrical current through the composition to deposit an alloy comprising copper and tin on the substrate.

7. The method of claim 6, wherein current density ranges from 0.01 A/dm$^2$ to 20 A/dm$^2$.

8. The method of claim 6, wherein the mercaraotetrazoles are in the range of 0.001 g/L to 100 g/L.

9. The method of claim 6 wherein the substrate is a component of an electronic device or jewelry.

* * * * *